US012621588B2

(12) United States Patent
Hsu

(10) Patent No.: US 12,621,588 B2
(45) Date of Patent: May 5, 2026

(54) COMMUNICATION DEVICE

(71) Applicant: GEMTEK TECHNOLOGY CO., LTD., Hsinchu (TW)

(72) Inventor: Chih Yao Hsu, Hsinchu (TW)

(73) Assignee: GEMTEK TECHNOLOGY CO., LTD., Hsinchu (TW)

( * ) Notice: Subject to any disclaimer, the term of this patent is extended or adjusted under 35 U.S.C. 154(b) by 329 days.

(21) Appl. No.: 18/388,488

(22) Filed: Nov. 9, 2023

(65) Prior Publication Data

US 2025/0016477 A1 Jan. 9, 2025

Related U.S. Application Data

(60) Provisional application No. 63/525,581, filed on Jul. 7, 2023.

(51) Int. Cl.
H05K 7/20 (2006.01)
H04Q 1/02 (2006.01)
H05K 5/03 (2006.01)

(52) U.S. Cl.
CPC .............. H04Q 1/035 (2013.01); H05K 5/03 (2013.01); H05K 7/2039 (2013.01)

(58) Field of Classification Search
CPC ........ H04Q 1/035; H05K 5/03; H05K 7/2039; H05K 7/20418
See application file for complete search history.

(56) References Cited

U.S. PATENT DOCUMENTS

| | | | | |
|---|---|---|---|---|
| 5,086,269 A * | 2/1992 | Nobi | ........................ | G01R 1/04 |
| | | | | 324/750.08 |
| 6,510,226 B1 * | 1/2003 | Thomann | ............... | H04Q 1/035 |
| | | | | 379/413.04 |
| 6,621,975 B2 * | 9/2003 | Laporte | .................. | G02B 6/445 |
| | | | | 385/135 |
| 6,864,573 B2 * | 3/2005 | Robertson | .......... | H05K 7/20409 |
| | | | | 361/801 |
| 7,440,271 B2 * | 10/2008 | Chen | ........................ | G06F 1/187 |
| | | | | 248/539 |
| 7,651,340 B2 * | 1/2010 | Barabi | ................. | G01R 1/0466 |
| | | | | 439/73 |

(Continued)

*Primary Examiner* — Imani N Hayman
*Assistant Examiner* — Hung Q Dang
(74) *Attorney, Agent, or Firm* — Maschoff Brennan

(57) ABSTRACT

A communication device includes a housing assembly, a heat dissipation module and a communication main unit. The housing assembly includes a bottom cover, a mounting bracket and a positioning component. The mounting bracket is movably disposed on the bottom cover and movable between an installation position and a pre-installation position via a guiding structure. The positioning component is connected to the bottom cover and configured to fix the mounting bracket in the installation position in a detachable manner. The heat dissipation module is fixed to the bottom cover. The mounting bracket is located farther away from a heat-absorbing surface of the heat dissipation module when in the pre-installation position than in the installation position. The communication main unit is detachably disposed on the mounting bracket. When the mounting bracket is in the installation position, the communication main unit is in physical contact with the heat-absorbing surface.

14 Claims, 8 Drawing Sheets

(56) References Cited

U.S. PATENT DOCUMENTS

| | | | | |
|---|---|---|---|---|
| 7,916,458 | B2 * | 3/2011 | Nelson | A01G 25/165 |
| | | | | 361/623 |
| 8,315,057 | B2 * | 11/2012 | Xu | H04Q 1/06 |
| | | | | 361/601 |
| 8,582,304 | B2 * | 11/2013 | Li | G06F 1/187 |
| | | | | 361/732 |
| 8,605,434 | B2 * | 12/2013 | Chao | H05K 5/0204 |
| | | | | 361/752 |
| 8,681,501 | B2 * | 3/2014 | Govindasamy | G06F 1/203 |
| | | | | 174/16.3 |
| 8,963,000 | B2 * | 2/2015 | Xiao | H02G 3/16 |
| | | | | 174/548 |
| 9,882,362 | B2 * | 1/2018 | Carapella | G02B 6/4448 |
| 10,031,306 | B2 * | 7/2018 | Sadasivan | G02B 6/44775 |
| 10,353,163 | B1 * | 7/2019 | Hanks | G02B 6/4448 |
| 10,462,918 | B2 * | 10/2019 | Wu | H05K 5/03 |
| 10,499,544 | B1 * | 12/2019 | Rahm | H05K 5/0226 |
| 10,931,039 | B2 * | 2/2021 | Mahoney | H01R 9/05 |
| 10,976,512 | B2 * | 4/2021 | Carapella | G02B 6/4441 |
| 11,581,626 | B2 * | 2/2023 | Rosenthal | H01Q 1/2291 |
| 11,617,285 | B2 * | 3/2023 | Shearman | H05K 7/20509 |
| | | | | 361/700 |
| 11,659,670 | B2 * | 5/2023 | McDowell | H05K 5/10 |
| | | | | 361/679.01 |
| 11,694,863 | B2 * | 7/2023 | McDonald | H01H 13/86 |
| | | | | 174/53 |
| 11,719,900 | B2 * | 8/2023 | Carapella | H02G 3/083 |
| | | | | 385/135 |
| 11,812,072 | B2 * | 11/2023 | Mahoney | G01S 5/02585 |
| 11,839,057 | B2 * | 12/2023 | Yu | H05K 7/20409 |
| 12,156,381 | B2 * | 11/2024 | Chung | H05K 7/20454 |
| 12,218,700 | B2 * | 2/2025 | Stewart | H04B 1/3827 |
| 2006/0153516 | A1 * | 7/2006 | Napiorkowski | H04Q 1/028 |
| | | | | 385/134 |
| 2010/0128432 | A1 * | 5/2010 | Miller | G06F 1/20 |
| | | | | 361/679.54 |
| 2015/0146380 | A1 * | 5/2015 | Lu | H05K 7/14322 |
| | | | | 361/709 |
| 2018/0228047 | A1 * | 8/2018 | Ota | H05K 7/14329 |
| 2020/0018514 | A1 * | 1/2020 | Howe | F24F 11/52 |
| 2023/0156935 | A1 * | 5/2023 | Shimizu | H02G 3/08 |
| | | | | 361/807 |
| 2024/0292558 | A1 * | 8/2024 | Gupta | H05K 7/20409 |

* cited by examiner

1

COMMUNICATION DEVICE

CROSS-REFERENCE TO RELATED APPLICATIONS

This non-provisional application claims priority under 35 U.S.C. § 119(a) to U.S. Provisional Application No. 63/525, 581, filed on Jul. 7, 2023, the entire contents of which are hereby incorporated by reference.

TECHNICAL FIELD

This disclosure relates to a communication device, more particularly to a communication device where a communication main unit is in good thermal contact with a heat dissipation module.

BACKGROUND

In general, a suspension bracket inside a casing of a communication device is typically used with wall-mounting holes (e.g., keyhole slots) in conjunction with hooks to suspend the main unit. The process of fixing the main unit involves hanging the main unit on hooks through the wall-mounting holes and then pushing the main unit downward to secure it in place. On the other hand, the communication device usually includes a heat sink to dissipate the heat generated by the main unit to the exterior of the casing, and a heat transfer pad is placed between the main unit and the heat sink to serve as a heat transfer medium.

However, if the main unit is fixed using the aforementioned wall-mounting method, shear forces may occur between the main unit and the heat transfer pad on the wall, potentially preventing the heat transfer pad from achieving good thermal contact with the main unit, which can affect the heat dissipation efficiency of the heat sink. Therefore, ensuring good thermal contact between the main unit and the heat transfer pad is a challenge for researchers in this field.

SUMMARY

The present disclosure is to provide a communication device capable of addressing the problem in conventional communication devices where the main unit cannot be in good thermal contact with the heat transfer pad.

One embodiment of the present disclosure provides a communication device including a housing assembly, a heat dissipation module and a communication main unit. The housing assembly includes a bottom cover, a mounting bracket and at least one positioning component. The mounting bracket is movably disposed on the bottom cover, and the mounting bracket is movable relative to the bottom cover between an installation position and a pre-installation position via a guiding structure. The positioning component is connected to the bottom cover, and the positioning component is configured to fix the mounting bracket in the installation position in a detachable manner. The heat dissipation module is fixed to the bottom cover, and the heat dissipation module has a heat-absorbing surface. The mounting bracket is located farther away from the heat-absorbing surface when in the pre-installation position than in the installation position. The communication main unit is detachably disposed on the mounting bracket. In addition, when the mounting bracket is in the installation position, the communication main unit is in physical contact with the heat-absorbing surface of the heat dissipation module.

According to the communication device as described above, if maintenance personnel want to install the communication main unit within the housing assembly, they may first position the mounting bracket in the pre-installation position, and then, assemble and secure the communication main unit onto the mounting bracket. Subsequently, the maintenance personnel may move both the mounting bracket and the communication main unit to the installation position, ensuring that the communication main unit is in physical contact with the heat-absorbing surface of the heat dissipation module. Therefore, it prevents the communication main unit from coming into direct contact with the heat dissipation module when the communication main unit is pre-assembled on the housing assembly, thereby preventing shear forces between the communication main unit and the heat dissipation module, which ensures that there is good thermal contact between the communication main unit and the heat dissipation module.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Aspects and advantages of the invention will become apparent from the following detailed descriptions with the accompanying drawings. For purposes of explanation, one or more specific embodiments are given to provide a thorough understanding of the invention, and which are described in sufficient detail to enable one skilled in the art to practice the described embodiments. It should be understood that the following descriptions are not intended to limit the embodiments to one specific embodiment. On the contrary, it is intended to cover alternatives, modifications, and equivalents as can be included within the spirit and scope of the described embodiments as defined by the appended claims.

Figure 1:
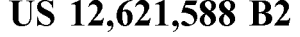
FIG. 1 is a perspective view of a communication device in accordance with one embodiment of the disclosure.
Figure 2:
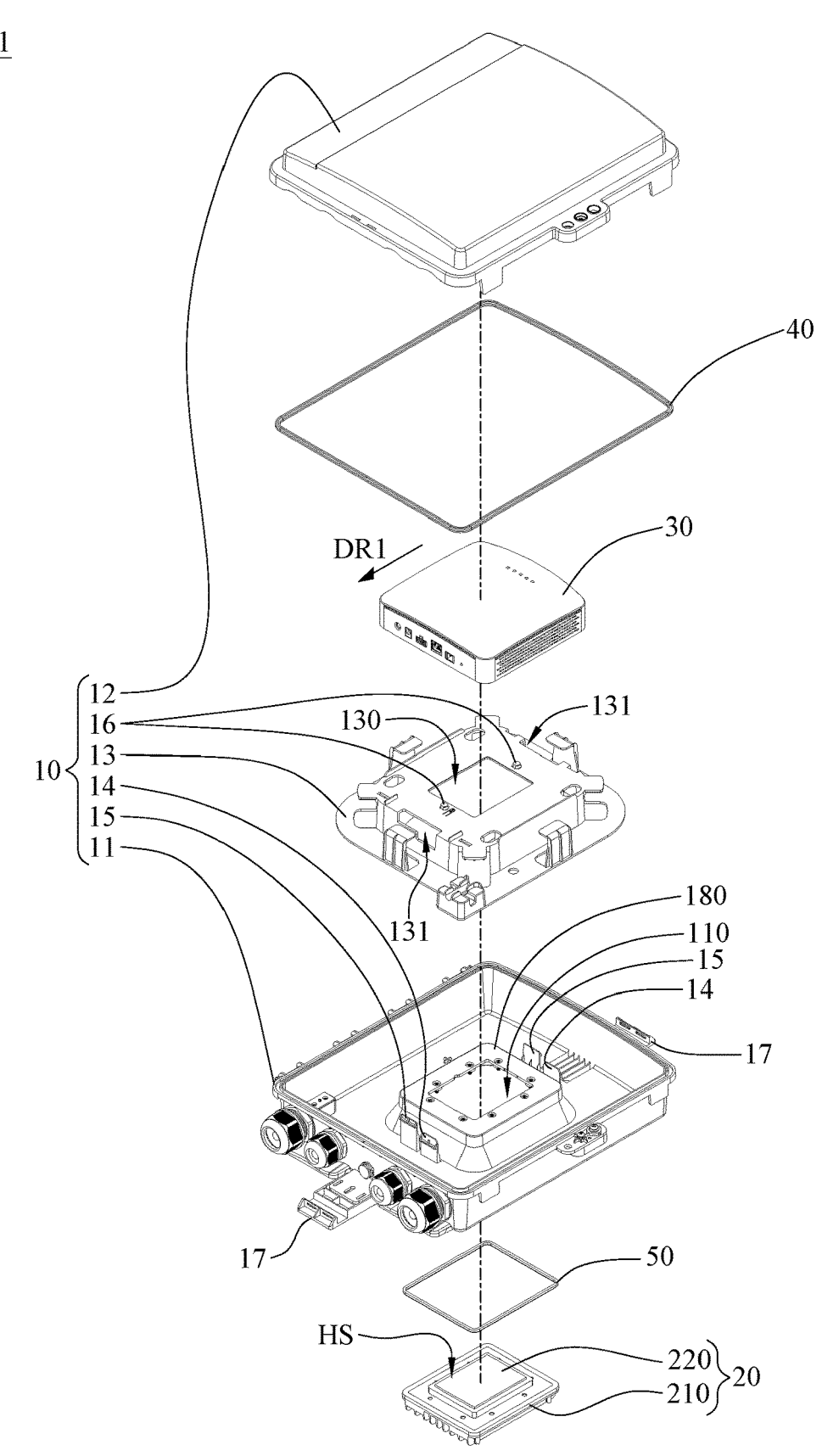
FIG. 2 is an exploded view of the communication device in FIG. 1.
Figure 3:
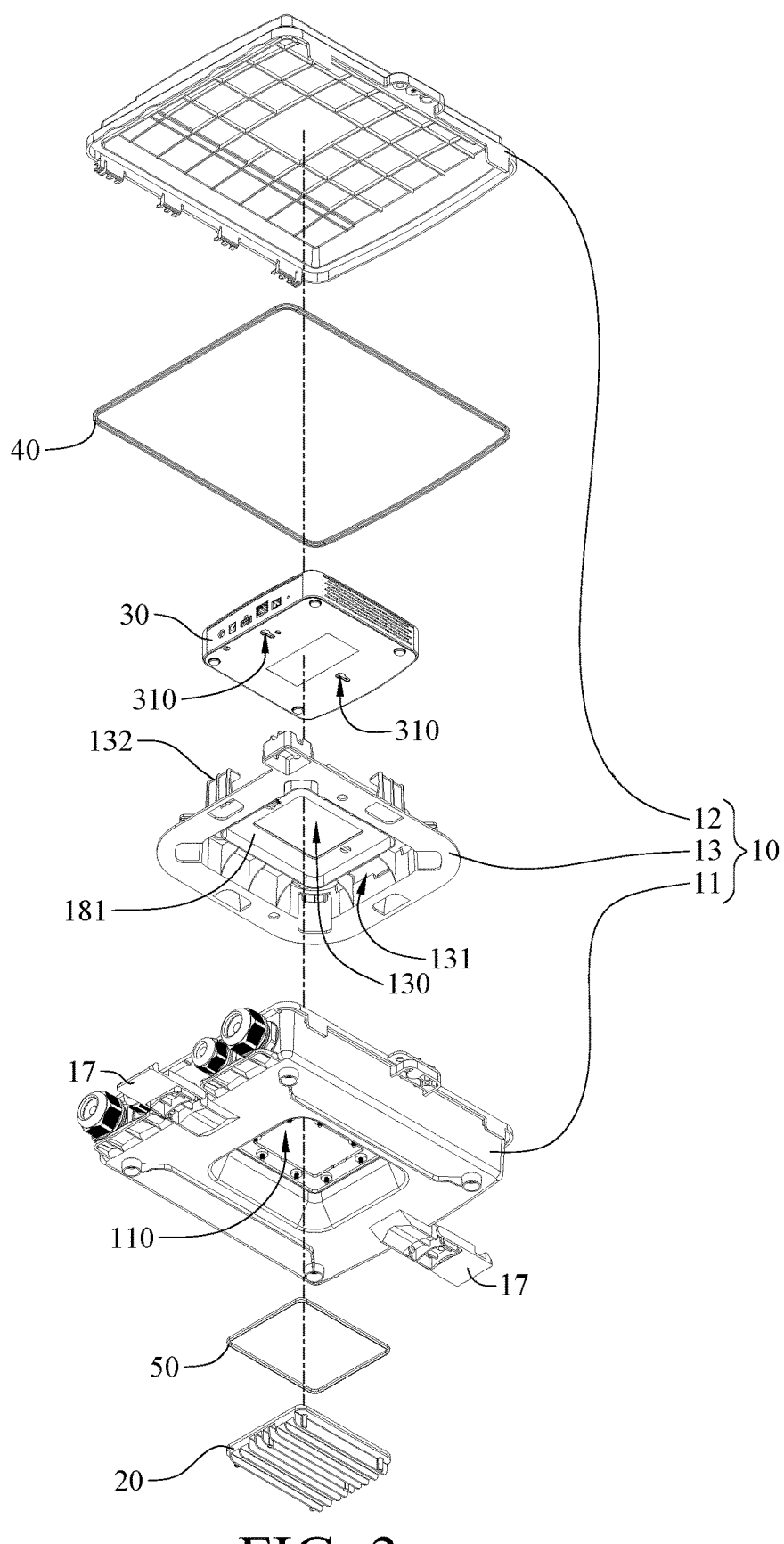
FIG. 3 is another exploded view of the communication device in FIG. 1.
Figure 4:
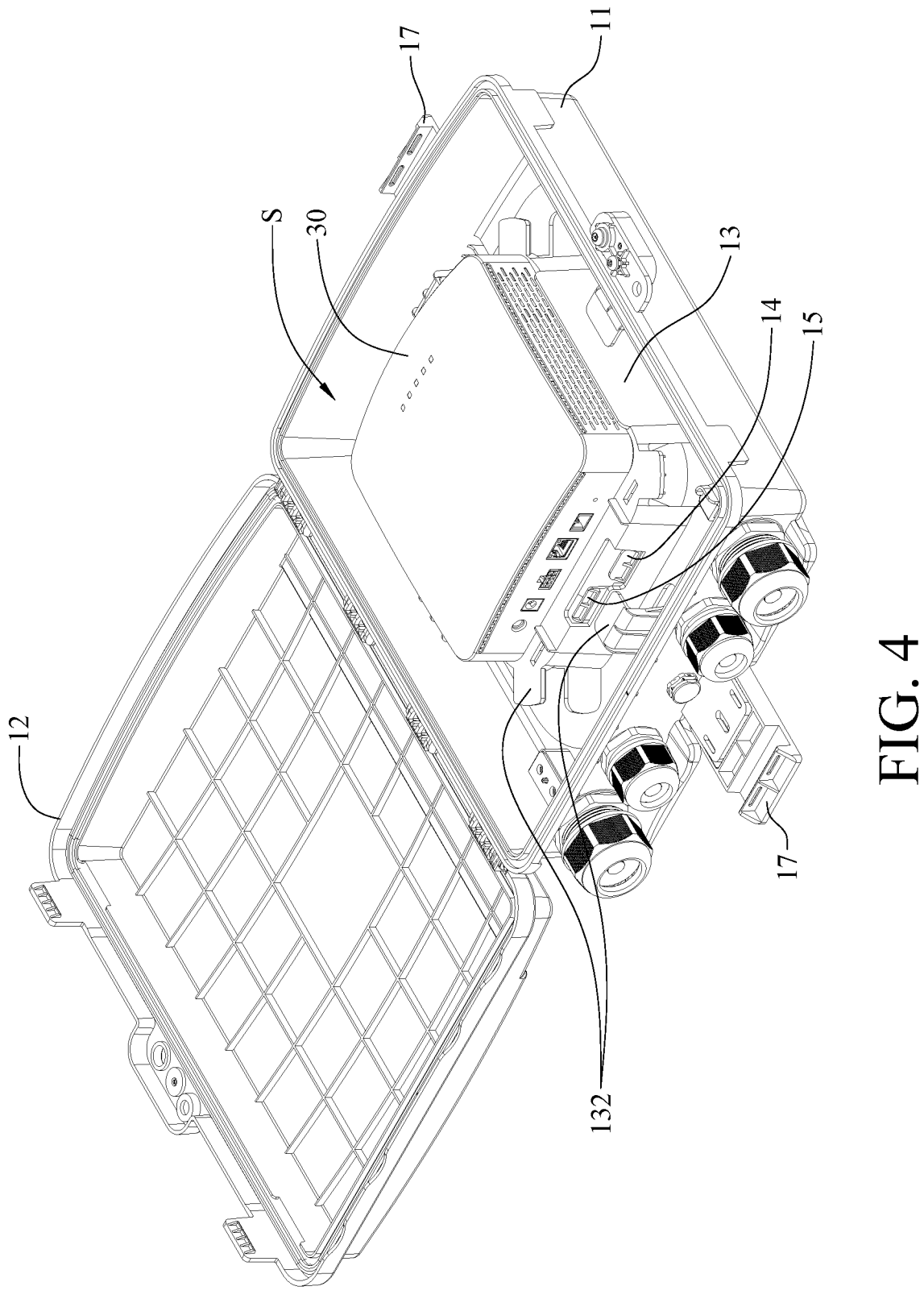
FIG. 4 is a schematic view of a housing assembly of communication device in FIG. 1, with a top cover pivoted relative to a bottom cover of the housing assembly to be in an opened state to expose components in an interior accommodation space.

Please refer to FIG. 1 to FIG. 4. FIG. 1 is a perspective view of a communication device in accordance with one embodiment of the disclosure, FIG. 2 is an exploded view of the communication device in FIG. 1, FIG. 3 is another exploded view of the communication device in FIG. 1, and FIG. 4 is a schematic view of a housing assembly of communication device in FIG. 1, with a top cover pivoted relative to a bottom cover of the housing assembly to be in an opened state to expose components in an interior accommodation space.

In this embodiment, a communication device 1 is provided. The communication device 1 includes a housing assembly 10, a heat dissipation module 20, a communication main unit 30, a first sealing ring 40 and a second sealing ring 50.

The housing assembly 10 includes a bottom cover 11, a top cover 12, a mounting bracket 13, two positioning components 14, two blocking components 15 and two engagement protrusions 16.

The top cover 12 is pivotally coupled to the bottom cover 11, such that the top cover 12 is pivotable relative to the bottom cover 11 to be in an opened state (as shown in FIG. 4) or in a closed state (as shown in FIG. 1). When the top cover 12 is in the opened state, the housing assembly 10 exposes the communication main unit 30 for convenient maintenance or replacement of the communication main unit 30 by maintenance personnel. In this embodiment, when the top cover 12 is in the closed state, the top cover 12 can be fixed to the bottom cover 11 via buckles 17 pivotally disposed on two opposite sides of the bottom cover 11. The top cover 12 and the bottom cover 11 together form an interior accommodation space S for receiving components, such as the communication main unit 30. The bottom cover 11 has a through hole 110 that connects the interior accommodation space S and an exterior space. The present disclosure is not limited to the installation manner of the top cover 12 and the bottom cover 11 as introduced above; in other embodiments, for example, the top cover may be movably and detachably disposed on the bottom cover via, fasteners, such as screws.

Figure 5:
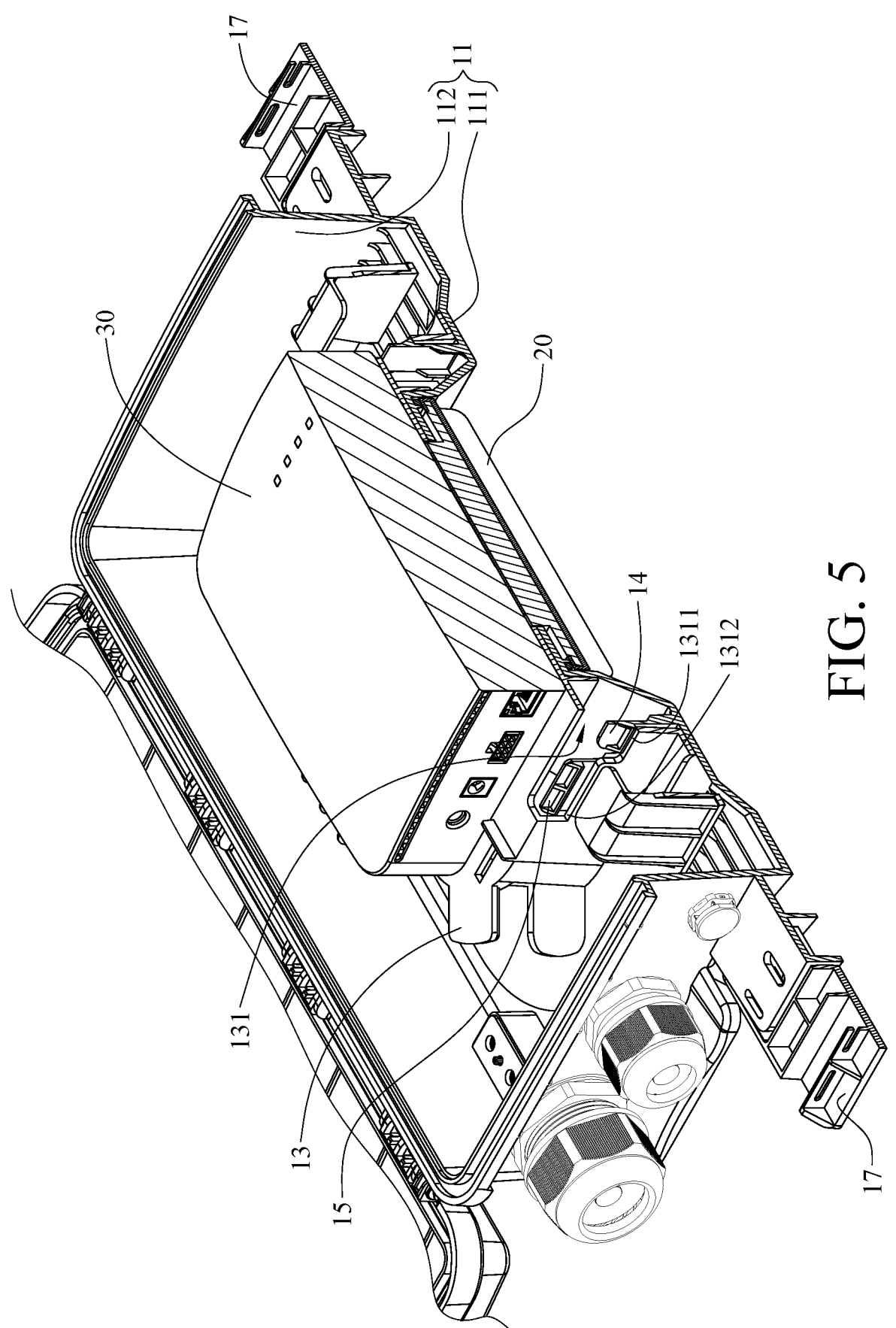
FIG. 5 is a sectional view of the communication device in FIG. 4.
Figure 6:
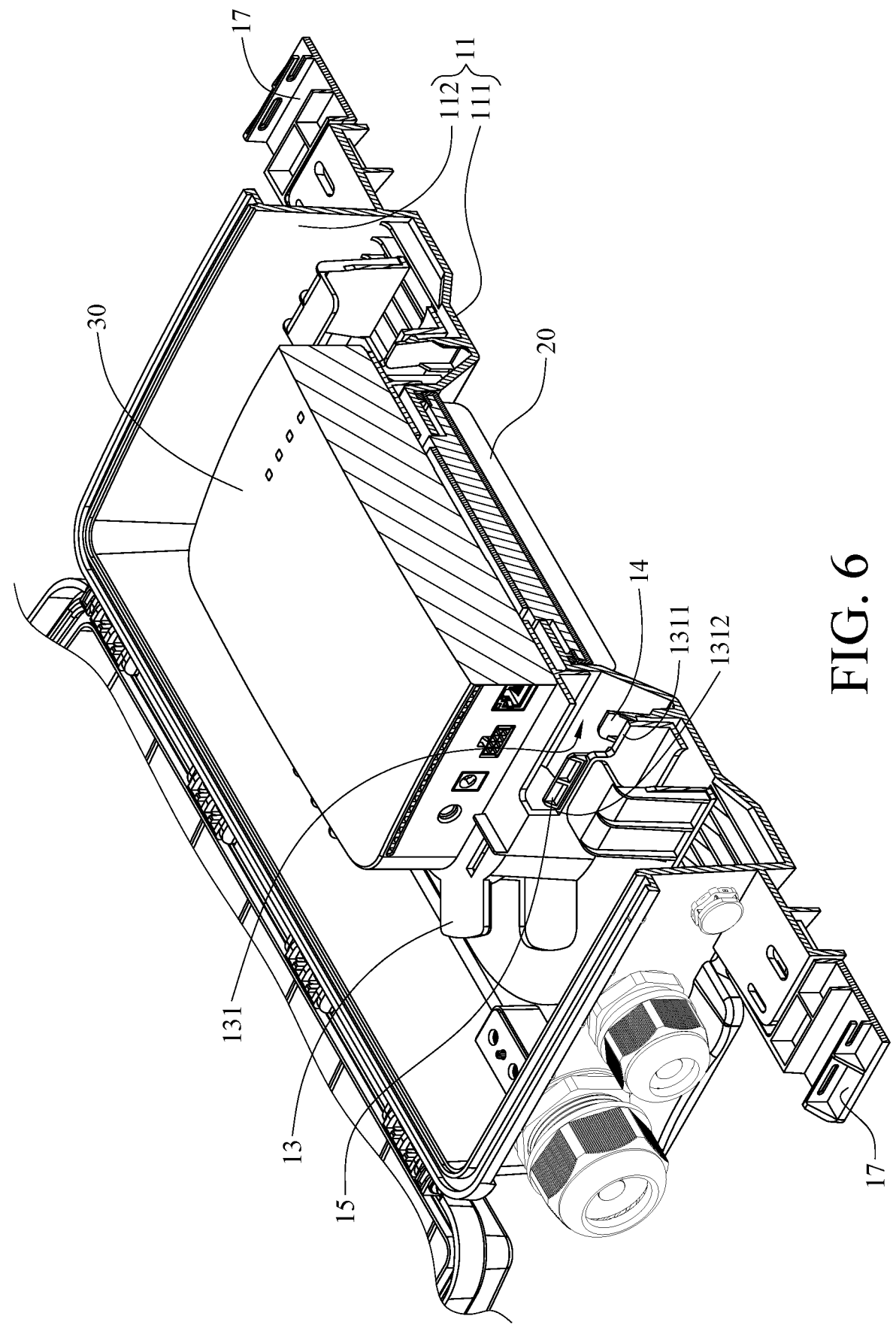
FIG. 6 is a sectional view of the communication device in FIG. 4, with a mounting bracket of the housing assembly moved to a pre-installation position.
Figure 7:
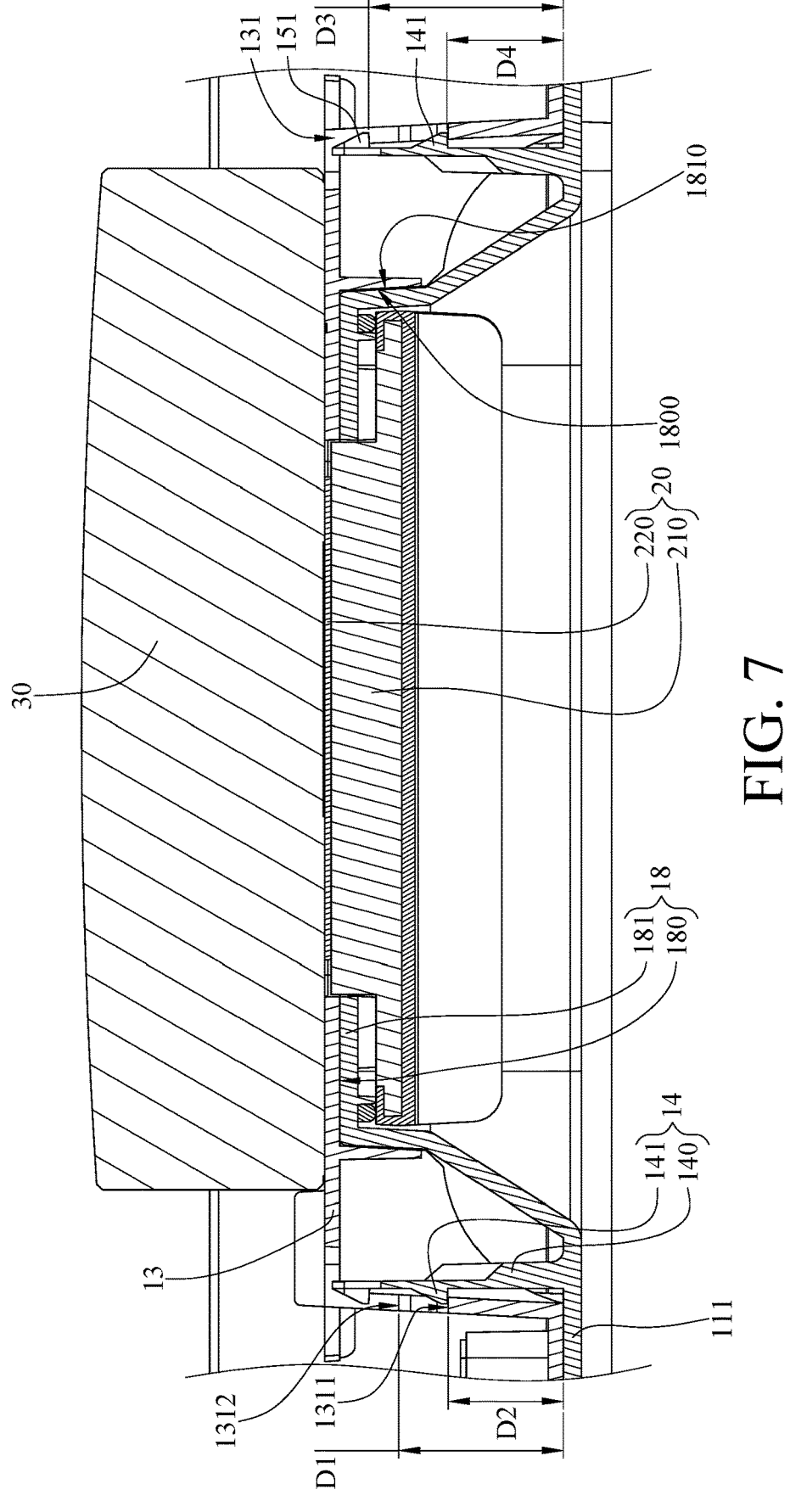
FIG. 7 is a cross-sectional view of the communication device in FIG. 4, with the mounting bracket in an installation position.
Figure 8:
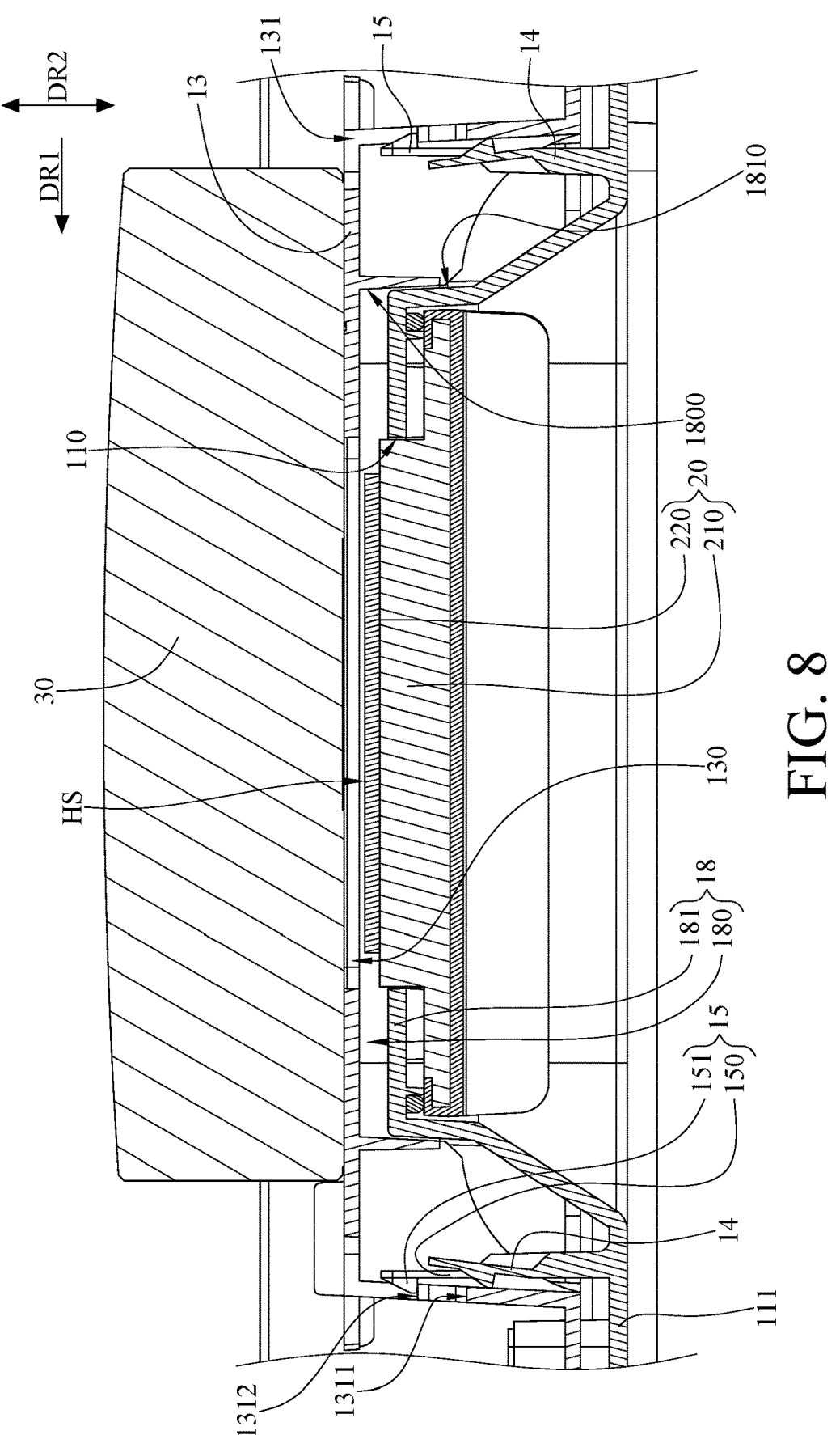
FIG. 8 is a cross-sectional view of the communication device in FIG. 4, with the mounting bracket in the pre-installation position.

Please refer to FIG. 5 to FIG. 8. FIG. 5 is a sectional view of the communication device in FIG. 4, FIG. 6 is a sectional view of the communication device in FIG. 4, with a mounting bracket of the housing assembly moved to a pre-installation position, FIG. 7 is a cross-sectional view of the communication device in FIG. 4, with the mounting bracket in an installation position, and FIG. 8 is a cross-sectional view of the communication device in FIG. 4, with the mounting bracket in the pre-installation position.

The bottom cover 11 includes a bottom plate 111 and a plurality of side plates 112, and the side plates 112 are connected to the bottom plate 111 and surround the bottom plate 111.

The mounting bracket 13 is located in the interior accommodation space S and movably disposed on the bottom plate 111 of the bottom cover 11, and the mounting bracket 13 is movable relative to the bottom cover 11 between an installation position (as shown in FIG. 5 and FIG. 7) and a pre-installation position (as shown in FIG. 6 and FIG. 8) via a guiding structure 18. In specific, the guiding structure 18 includes a guiding recess 180 and a guiding protrusion 181. The guiding recess 180 is disposed on the mounting bracket 13 and has an inclined annular inner surface 1800, and the guiding protrusion 181 is disposed on the bottom plate 111 of the bottom cover 11 and has an inclined annular outer surface 1810. The guiding protrusion 181 is configured to be received in the guiding recess 180, the guiding recess 180 is movable relative to the guiding protrusion 181, and the inclined annular inner surface 1800 is slidably in contact with the inclined annular outer surface 1810, such that the mounting bracket 13 can be supported on the bottom cover 11 and guided to be moved relative to the bottom cover 11 between the installation position and the pre-installation position. In addition, the guiding structure 18 can restrict a vertical displacement of the mounting bracket 13 during its movement process. The present disclosure is not limited to the features of the guiding structure 18 as described above. In other embodiments, the guiding structure may be integrated with the positioning component and blocking component of the mounting bracket and the housing assembly, or the engagement slot of the mounting bracket and the positioning component and blocking component of the housing assembly can also serve as guiding structures providing guiding effects.

The mounting bracket 13 has an opening 130 and two engagement slots 131. The opening 130 is configured to correspond to the through hole 110 of the bottom cover 11, and the two engagement slots 131 are located at two opposite sides of the mounting bracket 13. Each of the engagement slots 131 has a first contact surface 1311 and a second contact surface 1312 facing away from the bottom plate 111, and a distance D1 between the second contact surface 1312 and the bottom plate 111 of the bottom cover 11 is larger than a distance D2 between the first contact surface 1311 and the bottom plate 111 of the bottom cover 11.

The two positioning components 14 are located in the interior accommodation space S and connected to the bottom cover 11, the two positioning components 14 are disposed opposite to each other, and the two positioning components 14 are located on opposite sides of the mounting bracket 13. Furthermore, the two positioning components 14 correspond to the first contact surfaces 1311 of the two engagement slots 131 of the mounting bracket 13, respectively, and the mounting bracket 13 is fixed in the installation position via the positioning components 14. In specific, each of the positioning components 14 includes a flexible portion 140 and a positioning protrusion 141 that are connected to each other. The flexible portion 140 has a fixed end and a free end that are opposite to each other, and the fixed end is fixed to the bottom plate 111 of the bottom cover 11. The positioning protrusion 141 protrudes from the free end, and the positioning protrusion 141 is configured to removably press against the first contact surface 1311 of the engagement slot 131 so as to block the mounting bracket 13, thereby fixing the mounting bracket 13 in the installation position in a detachable manner.

The two blocking components 15 are located in interior accommodation space S and connected to the bottom cover 11, the two blocking components 15 are disposed opposite to each other, and the two blocking components 15 are located on opposite sides of the mounting bracket 13. In addition, the two blocking components 15 correspond to the second contact surfaces 1312 of the two engagement slots 131 of the mounting bracket 13, respectively, and the mounting bracket 13 can be fixed in the pre-installation position by the blocking components 15. In specific, each of the blocking components 15 includes a fixed portion 150 and a blocking protrusion 151 that are connected to each other. The fixed portion 150 is flexible and fixed to the bottom plate 111 of the bottom cover 11, and the blocking protrusion 151 protrudes from the fixed portion 150. The blocking protrusion 151 is configured to removably press against the second contact surface 1312 of the engagement slots 131 so as to block the mounting bracket 13, thereby fixing the mounting bracket 13 in the pre-installation position in a detachable manner.

In this embodiment, one of the positioning components 14 and one of the blocking components 15 are disposed adjacent to each other and both correspond to one of the engagement slots 131, and the other of the positioning components 14 and the other of the blocking components 15 are disposed adjacent to each other and both correspond to the other of the engagement slots 131. Furthermore, a distance D3 between the blocking protrusion 151 of the blocking component 15 and the bottom plate 111 of the bottom cover 11 is larger than a distance D4 between the positioning protrusion 141 of the positioning component 14 and the bottom plate 111 of the bottom cover 11. The present disclosure is not limited to the number of the positioning components 14 and the blocking components 15; in other embodiments, the number of the positioning component and the number of the blocking component may both be one or more than two.

The engagement protrusions 16 are fixed to the mounting bracket 13, and the engagement protrusions 16 are configured for engagement holes 310 of the communication main unit 30 to engage therewith. In addition, each of the engagement protrusions 16 includes a head part and a neck part that are connected to each other, the neck part is fixed to the mounting bracket 13 and located between the head part and the mounting bracket 13, and a width of the head part is larger than a width of the neck part so as to form a hook structure configured to engage with the engagement hole 310 which is, for example, a keyhole slot.

The heat dissipation module 20 includes a heat sink 210 and a thermal pad 220. The heat sink 210 has, for example, a fin structure and is fixed to the bottom cover 11 of the housing assembly 10, and the heat sink 210 is located in the exterior space and extends in the through hole 110 of the bottom cover 11. The thermal pad 220 is located in the interior accommodation space S of the housing assembly 10 and disposed on the heat sink 210, and the thermal pad 220 corresponds to the through hole 110 of the bottom cover 11. Moreover, the heat dissipation module 20 has a heat-absorbing surface HS, and the heat-absorbing surface HS is located at the thermal pad 220. Furthermore, the mounting bracket 13 is located farther away from the heat-absorbing surface HS of the heat dissipation module 20 in the pre-installation position than in the installation position. The present disclosure is not limited to the structural features of the heat dissipation module 20 as introduced above; for example, the heat dissipation module may not have the thermal pad in other embodiments.

The communication main unit 30 is located in the interior accommodation space S of the housing assembly 10 and detachably disposed on the mounting bracket 13. The communication main unit 30 is disposed on one side of the mounting bracket 13 located away from the heat dissipation module 20 and corresponds to the opening 130 of the mounting bracket 13, and the opening 130 of the mounting bracket 13 exposes the communication main unit 30. Therefore, when the mounting bracket 13 is located in the installation position, the thermal pad 220 is in thermal contact with the communication main unit 30 through the opening 130 of the mounting bracket 13 and the through hole 110 of the bottom cover 11.

Furthermore, as shown in FIG. 3, the communication main unit 30 has the two engagement holes 310, and the engagement holes 310 are keyhole slots. Each of the engagement holes 310 includes a wide part and a narrow part that are connected to each other, and a width of the wide part is larger than a width of the narrow part. As shown in FIG. 2, the width of the head part of the engagement protrusion 16 of the housing assembly 10 is smaller than the width of the wide part of the engagement hole 310 and larger than the width of the narrow part of the engagement hole 310, and the width of the neck part of the engagement protrusion 16 is smaller than the width of narrow part of the engagement hole 310. The installation process of the communication main unit 30 onto the mounting bracket 13 is described below. After the head parts of the engagement protrusions 16 pass through the wide parts of the engagement holes 310 and thus the neck parts of the engagement protrusions 16 are disposed through the wide parts of the engagement holes 310, the communication main unit 30 can be moved relative to the mounting bracket 13 along an engaging direction DR1 parallel to the heat-absorbing surface HS of the heat dissipation module 20, moving the neck parts of the engagement protrusions 16 from the wide parts to the narrow parts of the engagement holes 310. Therefore, the engagement protrusions 16 are fixed and engaged with the narrow parts of the engagement holes 310, such that the communication main unit 30 is detachably disposed on the mounting bracket 13. The installation method of the communication main unit 30 onto the housing assembly 10 of the present disclosure is not limited to the fastening means using the engagement holes 310 and the engagement protrusions 16 as introduced above; in other embodiments, the communication main unit may be installed onto the housing assembly through other fastening means, such as screws.

The first sealing ring 40 surrounds the interior accommodation space S of the housing assembly 10 and clamped by the top cover 12 and the bottom cover 11 of the housing assembly 10. The second sealing ring 50 surrounds the through hole 110 of the bottom cover 11 and clamped by the heat sink 210 and the bottom cover 11. Therefore, It effectively isolates the interior accommodation space S of the housing assembly 10 from the exterior space to prevent external elements such as moisture and dust from entering the interior accommodation space S, achieving the waterproof and dustproof functionality of the housing assembly 10, which helps to prevent issues of component damages due to moisture or dust accumulation within the housing assembly 10. It should be noted that the first sealing ring 40 and the second sealing ring 50 are optional components; in other embodiments, when the waterproof and/or dustproof requirements of the communication device are not strict, the communication device may not have the first sealing ring and the second sealing ring.

As shown in FIG. 5 and FIG. 7, when the mounting bracket 13 is in the installation position, the thermal pad 220 passes through the opening 130 of the mounting bracket 13 and is clamped by the communication main unit 30 and the heat sink 210, such that the communication main unit 30 is in physical contact with the heat-absorbing surface HS of the thermal pad 220 of the heat dissipation module 20. In the meantime, the positioning protrusions 141 are removably disposed through the engagement slots 131 and press against the mounting bracket 13 so as to fix the mounting bracket 13 in the installation position.

If maintenance personnel want to repair or replace the communication main unit 30, they may move the positioning components 14 so as to release the mounting bracket 13 from being blocked by the positioning components 14, allowing the mounting bracket 13 to be moved from the installation position to the pre-installation position, such that the communication main unit 30 disposed on the mounting bracket 13 may firstly be separated from the heat dissipation module 20 (i.e., the communication main unit 30 is not in contact with the heat-absorbing surface HS of the thermal pad 220), and then removed from the mounting bracket 13. In specific, when the free ends of the flexible portions 140 are moved away from the engagement slots 131 by an external force (e.g., forces applied by the maintenance personnel), the positioning protrusions 141 are removed from the engagement slots 131 and thus separated from the first contact surfaces 1311 of the engagement slots 131. Therefore, the mounting bracket 13 has a degree of freedom to be moved in a direction DR2 perpendicular to the heat-absorbing surface HS, and thus the mounting bracket 13 is movable between the installation position and the pre-installation position. In addition, when the mounting bracket 13 is released from the installation position, the mounting bracket 13 can be moved between the installation position and the pre-installation position by an external force perpendicular to the heat-absorbing surface HS.

As shown in FIG. 6 and FIG. 8, when the mounting bracket 13 is in the pre-installation position, the blocking protrusions 151 of the blocking components 15 are disposed through the engagement slots 131 and press against the mounting bracket 13 so as to block the mounting bracket 13, thereby fixing the mounting bracket 13 in the pre-installation position. In the meantime, if the maintenance personnel further want to remove both the communication main unit 30 and the mounting bracket 13 from the bottom cover 11, they may move the blocking components 15 so as to release the mounting bracket 13 from being blocked by the blocking components 15, so that the mounting bracket 13 can be removed from the bottom cover 11. In specific, when the mounting bracket 13 is in the pre-installation position, and ends of the fixed portions 150 of the blocking components 15 located away from the bottom cover 11 are moved away from the engagement slots 131 by an external force (e.g., forces applied by the maintenance personnel), the blocking protrusions 151 are removed from the engagement slots 131 and thus separated from the second contact surfaces 1312 of the engagement slots 131. Therefore, the mounting bracket 13 can be removed from the bottom cover 11.

On the other hand, if the maintenance personnel want to install the communication main unit 30 in the housing assembly 10, they may firstly position the mounting bracket 13 in the pre-installation position, and then assemble and secure the communication main unit 30 onto the mounting bracket 13. Afterward, they may move both the mounting bracket 13 and the communication main unit 30 to the installation position, ensuring that the communication main unit 30 is in physical contact with the heat-absorbing surface HS of the heat dissipation module 20. Therefore, it prevents the communication main unit 30 from coming into direct contact with the heat dissipation module 20 when the communication main unit 30 is pre-assembled on the housing assembly 10, thereby preventing shear forces between the communication main unit 30 and the heat dissipation module 20, which ensures that there is good thermal contact between the communication main unit 30 and the heat dissipation module 20. In further detail, through the aforementioned structural configuration and assembly method, the communication main unit 30 and the heat sink 210 can compress the thermal pad 220 therebetween (in the vertical direction), which ensures that the communication main unit 30 and the heat sink 210 maintain good thermal contact via the thermal pad 220, thereby effectively utilizing the heat dissipation performance of the thermal pad 220. In addition, the mounting bracket 13 moves from the pre-installation position to the installation position in a direction, for example, perpendicular to the heat-absorbing surface HS of the heat dissipation module 20, but the present disclosure is not limited thereto. In other embodiments, a direction in which the mounting bracket moves from the pre-installation position to the installation position may, for example, be at an acute angle with the heat-absorbing surface of the heat dissipation module.

In this embodiment, the mounting bracket 13 has a cable arrangement structure 132, and a cable (e.g., a fiber optic cable) of the communication main unit 30 may be coiled around the cable arrangement structure 132. However, the present disclosure is not limited thereto; in other embodiments, the mounting bracket may not have the cable arrangement structure, or the cable arrangement structure may be disposed on other components of the housing assembly.

In the above embodiment, the mounting bracket 13 is fixed in the installation position or the pre-installation position by the positioning components 14 and the blocking components 15, respectively, but the present disclosure is not limited thereto. In other embodiments, the mounting bracket can be selectively fixed in the installation position or the pre-installation position merely by the positioning components, and the communication device may not have the blocking components. In specific, in some embodiments, the positioning components of the housing assembly of the communication device are, for example, screw components, and the bottom cover may have screw holes. The positioning components are disposed through the through holes of the mounting bracket and screwed into the screw holes of the bottom cover. The positioning components each has a full fastening position and a half fastening position relative to the screw hole, and a length of the positioning component protruding from the screw hole in the full fastening position is shorter than a length of the positioning component protruding from the screw hole in the half fastening position. Furthermore, when the positioning components are in the full fastening position, the mounting bracket is fixed in the installation position by the positioning components; when the positioning components are in the half fastening position, the mounting bracket can be moved between the installation position and the pre-installation position.

In view of the above description, if maintenance personnel want to install the communication main unit within the housing assembly, they may firstly position the mounting bracket in the pre-installation position, and then, assemble and secure the communication main unit onto the mounting bracket. Subsequently, the maintenance personnel may move both the mounting bracket and the communication main unit to the installation position, ensuring that the communication main unit is in physical contact with the heat-absorbing surface of the heat dissipation module. Therefore, it prevents the communication main unit from coming into direct contact with the heat dissipation module when the communication main unit is pre-assembled on the housing assembly, thereby preventing shear forces between the communication main unit and the heat dissipation module, which ensures that there is good thermal contact between the communication main unit and the heat dissipation module.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A communication device comprising:

a housing assembly comprising a bottom cover, a mounting bracket and at least one positioning component, the mounting bracket movably disposed on the bottom cover, the mounting bracket movable relative to the bottom cover between an installation position and a pre-installation position via a guiding structure, the at least one positioning component connected to the bottom cover, and the at least one positioning component configured to fix the mounting bracket in the installation position in a detachable manner;

a heat dissipation module fixed to the bottom cover, the heat dissipation module having a heat-absorbing surface, and the mounting bracket being located farther away from the heat-absorbing surface when in the pre-installation position than in the installation position; and a communication main unit detachably disposed on the mounting bracket;

wherein when the mounting bracket is in the installation position, the communication main unit is in physical contact with the heat-absorbing surface of the heat dissipation module;

wherein the communication main unit has an engagement hole, the housing assembly further comprises an engagement protrusion fixed to the mounting bracket, the engagement hole is a keyhole slot, the engagement hole comprises a wide part and a narrow part that are connected to each other, a width of the wide part is larger than a width of the narrow part, the engagement protrusion comprises a head part and a neck part that are connected to each other, the neck part is fixed to the mounting bracket and located between the head part and the mounting bracket, a width of the head part is larger than a width of the neck part, and the width of the head part is smaller than the width of the wide part and larger than the width of the narrow part, and the width of the neck part is smaller than the width of the narrow part;

wherein after the head part of the engagement protrusion passes through the wide part of the engagement hole, and the neck part is disposed through the wide part, the communication main unit can be moved relative to the mounting bracket along an engaging direction parallel to the heat-absorbing surface for moving the neck part from the wide part to the narrow part and engaging the engagement protrusion with the narrow part of the engagement hole.

2. The communication device according to claim 1, wherein the heat dissipation module comprises a heat sink and a thermal pad, the heat sink is fixed to the bottom cover, the thermal pad is disposed on the heat sink, and the heat-absorbing surface is located at the thermal pad;

wherein when the mounting bracket is in the installation position, the thermal pad is clamped by and located between the communication main unit and the heat sink.

3. The communication device according to claim 2, wherein the mounting bracket has an opening, the communication main unit is disposed on a side of the mounting bracket located away from the heat dissipation module, the communication main unit corresponds to the opening, and the opening exposes the communication main unit;

wherein when the mounting bracket is in the installation position, the thermal pad passes through the opening, and the heat-absorbing surface is in physical contact with the communication main unit.

4. The communication device according to claim 2, wherein the housing assembly further comprises a top cover movably disposed on the bottom cover, the top cover and the bottom cover together form an interior accommodation space, the mounting bracket, the communication main unit and the at least one positioning component are located in the interior accommodation space, the bottom cover has a through hole that connects the interior accommodation space and an exterior space, the heat sink is located in the exterior space and extends into the through hole, and the thermal pad is located in the interior accommodation space and corresponds to the through hole.

5. The communication device according to claim 4, further comprising a first sealing ring and a second sealing ring, wherein the first sealing ring surrounds the interior accommodation space and is clamped by the top cover and the bottom cover, and the second sealing ring surrounds the through hole of the bottom cover and is clamped by the heat sink and the bottom cover.

6. The communication device according to claim 1, wherein the bottom cover comprises a bottom plate and a plurality of side plates, the plurality of side plates are connected to the bottom plate and surround the bottom plate, the mounting bracket is movably disposed on the bottom plate of the bottom cover, the mounting bracket has at least one engagement slot, the at least one positioning component comprises a flexible portion and a positioning protrusion that are connected to each other, the flexible portion has a fixed end and a free end that are opposite to each other, the fixed end is fixed to the bottom plate of the bottom cover, and the positioning protrusion protrudes from the free end;

wherein when the mounting bracket is in the installation position, the positioning protrusion is removably disposed through the at least one engagement slot and presses against the mounting bracket, such that the mounting bracket is fixed in the installation position; and wherein when the free end of the flexible portion is moved away from the at least one engagement slot by an external force, the positioning protrusion is removed from the at least one engagement slot, such that the mounting bracket has a degree of freedom to be movable between the installation position and the pre-installation position in a direction perpendicular to the heat-absorbing surface.

7. The communication device according to claim 6, wherein the housing assembly further comprises at least one blocking component, the at least one blocking component comprises a fixed portion and a blocking protrusion that are connected to each other, the fixed portion is fixed to the bottom plate of the bottom cover, and the blocking protrusion protrudes from the fixed portion;

wherein a distance between the blocking protrusion of the at least one blocking component and the bottom plate of the bottom cover is larger than a distance between the positioning protrusion of the at least one positioning component and the bottom plate of the bottom cover;

wherein when the mounting bracket is released from the installation position, the mounting bracket can be moved between the installation position and the pre-installation position by an external force perpendicular to the heat-absorbing surface; and wherein when the mounting bracket is in the pre-installation position, the blocking protrusion is disposed through the at least one engagement slot and presses against the mounting bracket so as to block the mounting bracket.

8. The communication device according to claim 7, wherein the fixed portion of the at least one blocking component is flexible;

wherein when the mounting bracket is in the pre-installation position, and an end of the fixed portion located away from the bottom cover is moved away from the at least one engagement slot by an external force, the blocking protrusion is removed from the at least one engagement slot for enabling the mounting bracket to be detachable from the bottom cover.

9. The communication device according to claim 7, wherein the at least one positioning component is disposed adjacent to the at least one blocking component, the at least one engagement slot has a first contact surface and a second contact surface, and a distance between the second contact surface and the bottom plate of the bottom cover is larger than a distance between the first contact surface and the bottom plate of the bottom cover;

wherein when the mounting bracket is in the installation position, the positioning protrusion is removably disposed through the at least one engagement slot and presses against the first contact surface for fixing the mounting bracket in the installation position;

wherein when the mounting bracket is in the pre-installation position, the blocking protrusion is disposed through the at least one engagement slot and presses against the second contact surface so as to block the mounting bracket.

10. The communication device according to claim 7, wherein the at least one positioning component comprises two positioning components, the two positioning component are disposed opposite to each other, the at least one blocking component comprises two blocking components, the two blocking components are disposed opposite to each other, the two positioning components are located on opposite sides of the mounting bracket, the two blocking components are located on opposite sides of the mounting bracket, the at least one engagement slot comprises two engagement slots, the two engagement slots are located at two opposite sides of the mounting bracket, one of the two positioning components and one of the two blocking components are disposed adjacent to each other and both correspond to one of the two engagement slots, and another of the two positioning components and another of the two blocking components are disposed adjacent to each other and both correspond to another of the two engagement slots.

11. The communication device according to claim 1, wherein the at least one positioning component comprises two positioning components, the two positioning components are disposed opposite to each other, and the mounting bracket is located between the two positioning components.

12. The communication device according to claim 1, wherein the mounting bracket has a cable arrangement structure, and a cable of the communication main unit is coiled around the cable arrangement structure.

13. The communication device according to claim 1, wherein the guiding structure comprises a guiding recess and a guiding protrusion, the guiding recess is disposed on the mounting bracket, the guiding recess has an inclined annular inner surface, the guiding protrusion is disposed on the bottom cover, the guiding protrusion has an inclined annular outer surface, the guiding protrusion is configured to be received in the guiding recess, the guiding recess is movable relative to the guiding protrusion, and the inclined annular inner surface is slidably in contact with the inclined annular outer surface, such that the mounting bracket can be moved relative to the bottom cover between the installation position and the pre-installation position.

14. The communication device according to claim 1, wherein the at least one positioning component is a screw component, the bottom cover has at least one screw hole, the at least one positioning component is disposed through a through hole of the mounting bracket and screwed into the at least one screw hole of the bottom cover, the at least one positioning component has a full fastening position and a half fastening position relative to the at least one screw hole, and a length of the at least one positioning component protruding from the at least one screw hole in the full fastening position is shorter than a length of the at least one positioning component protruding from the at least one screw hole in the half fastening position;

wherein when the at least one positioning component is in the full fastening position, the mounting bracket is fixed in the installation position by the at least one positioning component;

when the at least one positioning component is in the half fastening position, the mounting bracket is movable between the installation position and the pre-installation position.

\* \* \* \* \*